United States Patent [19]
Kohara et al.

[11] Patent Number: 5,091,772
[45] Date of Patent: Feb. 25, 1992

[54] SEMICONDUCTOR DEVICE AND PACKAGE

[75] Inventors: Masanobu Kohara; Takashi Kondo; Yomiyuki Yama, all of Itami, Japan

[73] Assignee: Mitsubishi Denki Kabushiki Kaisha, Tokyo, Japan

[21] Appl. No.: 405,313

[22] Filed: Sep. 11, 1989

[30] Foreign Application Priority Data

May 18, 1989 [JP] Japan .................................. 1-122783

[51] Int. Cl.$^5$ .............................................. H01L 23/02
[52] U.S. Cl. ............................................ 357/74; 357/80; 357/65; 357/72
[58] Field of Search ..................... 357/74, 80, 65, 72

[56] References Cited

FOREIGN PATENT DOCUMENTS 57-190330  11/1982  Japan ................................. 357/65
58-10850    1/1983  Japan ................................. 357/80
59-188954  10/1984  Japan ................................. 357/65
62-119933   1/1987  Japan ................................. 357/74

Primary Examiner—Andrew J. James
Assistant Examiner—Reginald A. Ratliff
Attorney, Agent, or Firm—Leydig, Voit & Mayer

[57] ABSTRACT

A package body for accommodating a semiconductor chip includes a plurality of inner-electrodes disposed on the package body and arranged in a multiplicity of rows around the semiconductor chip and outer-electrodes in the package body electrically connected to the corresponding inner-electrodes. The package body includes support sections disposed on the package body between the rows of inner-electrodes for supporting metal wires which connect the inner-electrodes to the electrodes of the semiconductor chip. A conductive layer for diminishing the floating capacitance between the metal wires may be included in the support sections.

18 Claims, 6 Drawing Sheets

F I G. 3
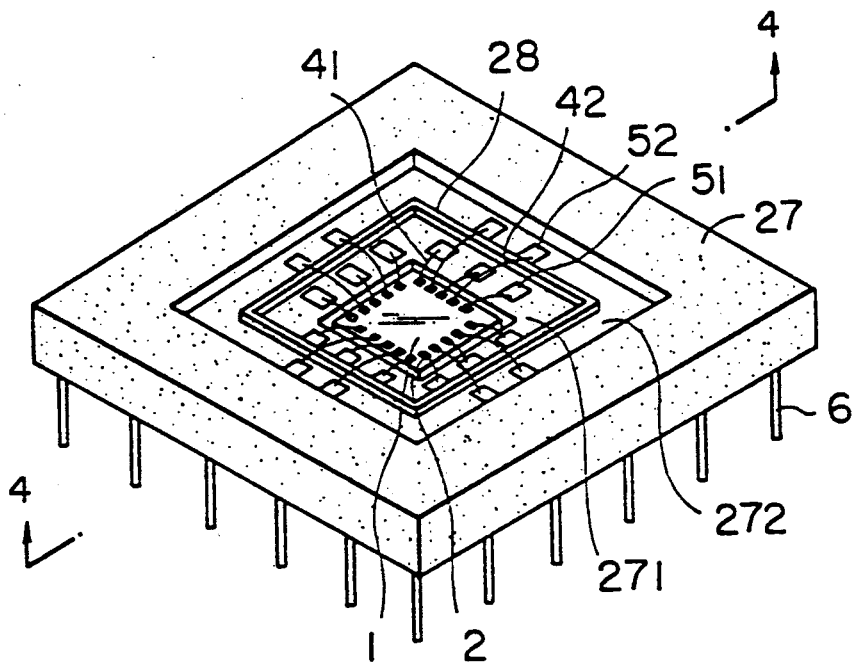
F I G. 4
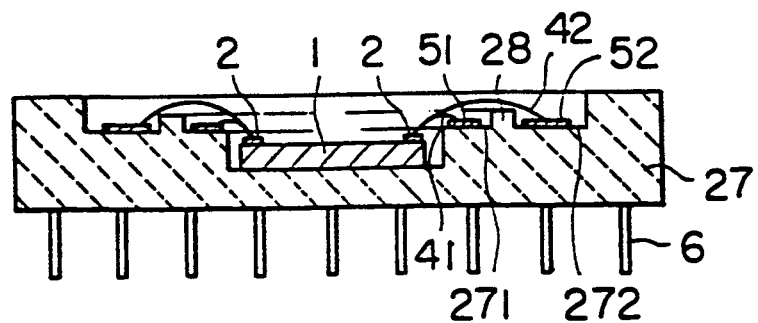

SEMICONDUCTOR DEVICE AND PACKAGE

BACKGROUND OF THE INVENTION

1. Field of the Invention

This invention relates to a semiconductor device package and, in particular, to a semiconductor device package for a semiconductor chip having a large number of electrodes.

2. Description of the Related Art

FIGS. 9 and 10 show an example of a semiconductor device on which a semiconductor chip having a large number of electrodes is mounted. Devices of this type have come to be used as the result of the recent trend toward high density semiconductor devices. In the semiconductor device shown, a semiconductor chip 1 is fixed within a rectangular recess 34 formed at the center of a package body 3. A first step section 31 is formed around the recess 34 of the package body 3 surrounding the recess 34. Formed around the first step section 31 is a second step section 32 which surrounds the first step section 31. A plurality of inner electrodes 51 and 52 are respectively formed on the first and second step sections 31 and 32, a plurality of electrodes 2 formed on the surface of the semiconductor chip 1 being connected to the inner electrodes 51 or 52 corresponding thereto through metal wires 41 or 42. Formed on the bottom surface of the package body 3 are a plurality of outer electrodes 6 which are respectively electrically connected to the corresponding inner electrodes 51 or 52.

In this semiconductor device, the inner electrodes 51 and 52 are arranged in a step-like manner with respect to each other, so that the pitch between adjacent inner electrodes 51 or 52 can be large notwithstanding the fact that the semiconductor chip 1 having a large number of electrodes is mounted thereon.

As shown in FIG. 10, however, while the distance $l_1$ between the electrodes 2 of the semiconductor chip 1 and the inner electrodes 51 on the first step section 31, which is relatively near the semiconductor chip 1, can be short, the distance $l_2$ between the electrodes 2 of the semiconductor chip 1 and the inner electrodes 52 on the second step section 32, which is spaced relatively far apart from the semiconductor chip 1, is inevitably large. Furthermore, if the number of electrodes of the semiconductor chip 1 is augmented and the inner electrodes are arranged in three steps or more, the distance between the outermost inner electrodes and the electrodes 2 of the semiconductor chip 1 must be made still larger. If, for example, the inner electrodes 51, 52 and 53 are, as shown in FIG. 11, arranged in three steps, i.e., on the first, second and third step sections 31, 32 and 33, the distance $l_3$ between the electrodes 2 of the semiconductor chip 1 and the inner electrodes 53 on the third step section 33 must be made still larger.

Hence, if the distance between the inner electrodes 53 provided on the package body 3 and the electrodes 2 of the semiconductor chip 1 is large, the metal wires 43 connecting them to each other inevitably need to be quite long. As a result, there is the danger that some of these long metal wires 43 may hang downwards on account of their own tendency to curl or due to oscillations exerted on this semiconductor device, etc., and thus came into contact with inner electrodes 51 or 52 on the first or second step section 31 or 32 situated therebelow, as shown in FIG. 11. There is also the danger of adjacent metal wires 42 coming into contact with each other, as shown in FIG. 12. Consequently, the device is subject to electrical short-circuit accidents, which implies a certain reduction in the reliability of the semiconductor device.

SUMMARY OF THE INVENTION

This invention aims at eliminating the above mentioned problems. It is accordingly an object of this invention to provide a semiconductor device which is capable of preventing short-circuit accidents occurring between its metal wires, even when a semiconductor chip having a large number of electrodes is mounted thereon, thus offering a high degree of reliability.

In accordance with this invention there is provided a semiconductor device comprising: a semiconductor chip on which a plurality of electrodes are formed, a package body for accommodating this semiconductor chip, a plurality of inner-electrodes provided on the package body and arranged in a multiplicity of rows around the semiconductor chip, a plurality of outer-electrodes provided on the package body and respectively electrically connected to the corresponding inner-electrodes, a plurality of metal wires for respectively connecting the electrodes of the semiconductor chip and the corresponding inner-electrodes, and a support means provided on the package body between the electrodes of an inner row and an outer row of the inner-electrodes for supporting the metal wires connecting the electrodes of the outer row to the electrodes of the semiconductor chip.

According to another aspect of this invention, there is provided a semiconductor device comprising: a semiconductor chip on which a plurality of electrodes are formed, a die-pad on which this semiconductor chip is mounted, a plurality of leads arranged around the semiconductor chip, a plurality of metal wires for connecting the electrodes of the semiconductor chip to respective leads, a support means for supporting the respective middle sections of these metal wires and having a conductive layer for diminishing the floating capacitance between the metal wires, and a package body for encapsulating the semiconductor chip, the die-pad, the connected leads, the metal wires, the support means and the conductor means in such a manner that portions of the leads are exposed outside of the package body.

BRIEF DESCRIPTION OF THE DRAWINGS

FIG. 3 is a perspective view showing a second embodiment of this invention;

FIG. 4 is a sectional view taken along the line II—II of FIG. 3;

DESCRIPTION OF THE PREFERRED EMBODIMENTS

Embodiments of this invention will now be described with reference to the attached drawings.

Figure 1:
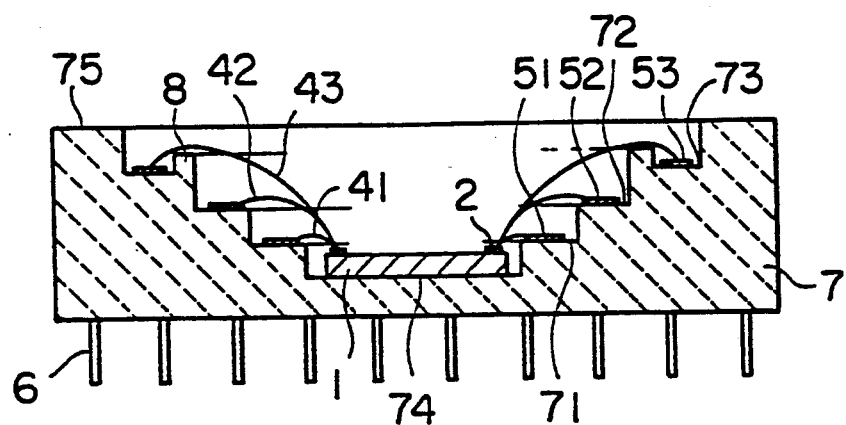
FIG. 1 is a sectional view showing a semiconductor device in accordance with a first embodiment of this invention.

In the embodiment shown in FIG. 1, the semiconductor device has a package body 7 made of a ceramic material, a semiconductor 1 being fixed within a rectangular recess 74 formed at the center of the package body 7. The package body 7 includes a first step section 71 arranged around the recess 74, a second step section 72 arranged around the first step section 71, and a third step section 73 arranged around the second step section 72, thus forming a staircase-like configuration. Formed and arranged on the first, second and third step sections 71, 72 and 73 are a plurality of first, second and third inner electrodes 51, 52 and 53, respectively, thereby forming inner-electrode rows in threes around the semiconductor chip 1. A plurality of electrodes 2 formed on the top surface of the semiconductor chip 1 are respectively connected to the corresponding inner electrodes 51, 52 and 53 through respective metal wires 41, 42 and 43. Formed on the bottom surface of the package body 7 are a plurality of outer electrodes 6 which are respectively connected to the corresponding inner electrodes 51, 52 and 53.

The package body 7 further includes a protrusion-like support section 8 which extends along the outer periphery of the second step section 72, separating the second and third step sections 72 and 73 from each other. This support section 8 is formed such that it is higher than the third step section 73 and lower than the outer edge 75 of the package body 7 relative to the recess 74. The metal wires 43 connecting the inner electrodes 53 to the electrodes 2 of the semiconductor chip 1 extend over the support section 8, the respective middle sections of the metal wires 43 being supported by this support section 8.

A flat plate-like cover member (not shown) is provided on the outer edge 75 of the package body 7, closing the package body 7.

Thus, in the semiconductor device of the first embodiment, the long metal wires 43 which connect the third inner electrodes 53, the outermost inner-electrode row, to the electrodes 2 of the semiconductor chip 1 are supported by the support section 8. These metal wires 43 are thereby prevented from hanging down, due to the tendency of the wires 43 to curl or due to oscillations exerted on the semiconductor device, from coming into contact with the second or first inner electrodes 52 or 51 on the second or first step section 72 or 71 situated below, or coming into contact with adjacent metal wires 43. This allows the pitch between adjacent inner electrodes to be a short distance, thereby making it possible to augment the number of pins that can be provided in a semiconductor device. Furthermore, since no excessive oscillations can be generated in the metal wires 43 when the semiconductor device is subjected to vibrations, troubles such as fatigue, destruction of the metal wires 43 or damage of the bonding sections in the metal wires 43 can be avoided.

While in the first embodiment the support section 8 is formed only between the second and third inner electrodes 52 and 53 of the sets of three inner electrodes 51, 52 and 53, a similar support section can be formed between the first and second inner electrodes 51 and 52. Further, the inner-electrode rows need not necessarily be arranged in threes. They may be similarly arranged in twos, fours, etc.

Figure 2:
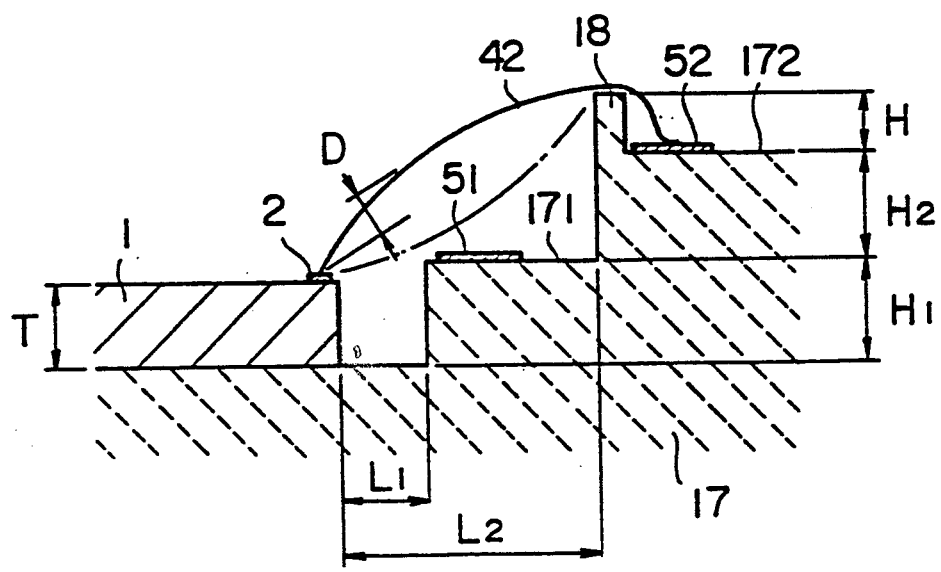
FIG. 2 is a sectional view showing the relationship between the height of the support section and slackness of the metal wire.

An observation regarding the height of the support section 8 will be made here with reference to FIG. 2. To simplify the explanation, FIG. 2 shows a case in which a package body 17 has a first and a second step section 171 and 172, a support section 18 being formed between them. When metal wire bonding, the metal wire is normally provided with some slack D. Accordingly, it is necessary to determine the height of the support section 18 so that, when the metal wire 42 hangs down due to this slack D as indicated by the broken line, the metal wire 42 does not come into contact with any of the inner electrodes 51 on the first step section 171. Suppose, in FIG. 2, the device dimensions are specified as follows: the thickness T of the semiconductor chip 1: 0.5 mm; the respective horizontal distances $L_1$ and $L_2$ from the side surface of the semiconductor chip 1 to the first and second step sections 171 and 172: 0.5 mm and 1.5 mm; the respective step heights $H_1$ and $H_2$ of the first and second step sections 171 and 172: 0.6 mm; and the slack D of the metal wire 42: 0.2 mm. The height H of the support section 18 as measured from the second step section 172 will then be about 0.3 mm or more.

The above-described support sections 8 and 18 are formed integrally from a ceramic material with the package bodies 7 and 17, and are prepared by being simultaneously fired with the package bodies 7 and 17. It is also possible to prepare separate annular support sections from an electrically insulating material while firing the package bodies without any support sections, and to bond these support sections to the package bodies.

FIGS. 3 and 4 show the second embodiment of this invention. In this embodiment, a package body 27 includes a first and a second step section 271 and 272 lying in the same plane, and a protrusion-like support section 28 being formed therebetween. First and second inner electrodes 51 and 52 are formed on the first and second step sections 271 and 272, respectively, and metal wires 42 which connect the second inner electrodes 52 to electrodes 2 on a semiconductor chip 1 are supported by the support section 28. If, as in this second embodiment, the inner electrodes 51 and 52 are arranged on one and the same plane, the inner electrodes 51 and 52 can be prepared in one process, thus facilitating the manufacture of semiconductor devices.

If the number of electrodes of the semiconductor chip 1 is large, it is desirable that the first and second inner electrodes 51 and 52 be arranged in a zigzag pattern, as shown in FIG. 3. This arrangement helps to prevent more reliably the metal wire 41 connected to the first inner electrodes 51 and the metal wire 42 connected to the second inner electrodes 52 from coming into contact with each other. It is also possible to arrange the inner-electrode rows in threes or more on one and the same plane. In that case, it is desirable that respective support sections be formed between adjacent inner-electrode rows.

Figure 5:
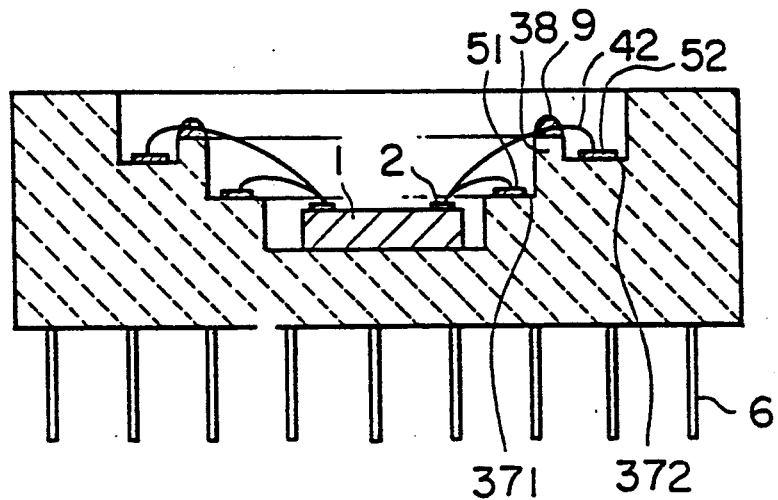
FIG. 5 is a sectional view showing a third embodiment of this invention.

FIG. 5 shows the third embodiment of this invention. A support section 38 is formed between a first and a second step section 371 and 372 of a package body 37, metal wires 42 and which connect second inner electrodes 52 formed on the second step section 372 to electrodes 2 on a semiconductor chip 1, are supported by the support section 38. The metal wires 42 are further fixed by means of an adhesive agent 9 disposed on the support section 38. By thus fixing the metal wire 42 supported by the support section 38 by means of the adhesive agent 9, the metal wires 42 are prevented from being displaced due to any oscillation, etc., which makes it possible to augment the number of pins that can be provided in a semiconductor device while avoiding any electrical short-circuit accidents, etc. of the metal wires 42.

The adhesive agent 9 constituting the adhesion means for the metal wires 42 may be selected from among a variety of materials, whether organic or inorganic. For example, it may be an epoxy resin or a polyimide resin. However, it should be noted that it must be an electrically insulating material. It does not matter whether the adhesive agent 9 is cured or not when used as long as it can fix the metal wires 42 in place.

Figure 6:
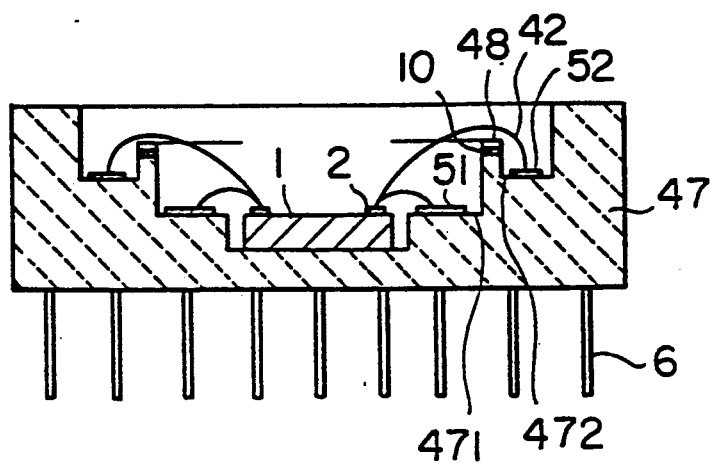
FIG. 6 is a sectional view showing a fourth embodiment of this invention.

FIG. 6 shows the fourth embodiment of this invention. In this embodiment, a conductive layer 10 is formed in a support section 48 formed between a first and a second step section 471 and 472 of a package body 47. First and second inner electrodes 51 and 52 are formed on the first and second step sections 471 and 472, respectively, metal wires 42, which connect the second inner electrodes 52 to electrodes 2 on a semiconductor chip 1, being supported by the support section 48. The longer the metal wires 42, the larger the floating capacitance between adjacent metal wires 42. Since in this embodiment the conductive layer 10 is formed in the support member 48, the floating capacitance between the metal wires 42 supported by the support section 48 is diminished, so that any generation of electrical noise in the metal wires 42 can be prevented. Consequently, this package embodiment is especially advantageous in a semiconductor device incorporating a high-speed IC.

The material of the conductive layer 10 may be selected from among a variety, of conductors, such as a molybdenum/manganese alloy or tungsten. Various methods may be adopted for providing the conductive layer 10 in the support section 48. For example, a conductive layer 10 whose surface is insulated through coating may be prepared beforehand and then bonded to a protrusion of a ceramic material that constitutes the principal part of the support section. Alternatively, a conductive layer 10 may be formed through evaporative deposition of a conductor on a ceramic protrusion which is integrally formed with the package body 47; an insulating layer is then formed by coating the conductive layer 10 thus formed.

If the conductive layer 10 is electrically connected through the package body 47 to the outer electrode 6 for grounding or for power source connection, the floating capacitance between the metal wires 42 can be diminished even more effectively.

Figure 7:
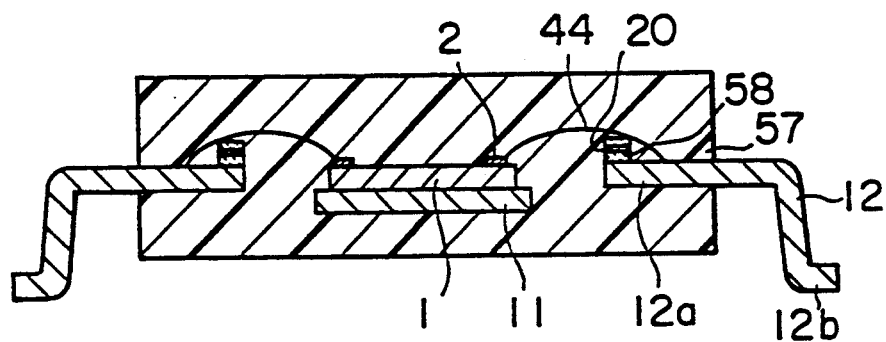
FIG. 7 is a sectional view showing a fifth embodiment of this invention.

FIG. 7 shows the fifth embodiment of this invention. In this embodiment, a support section having a conductive layer is formed in a resin-sealed semiconductor device. A semiconductor chip 1 is mounted on a die-pad 11 around which a plurality of leads 12 are arranged. One end of each of the leads 12 which is near the die pad 11 is an inner lead 12a, whereas the other end thereof which is spaced far apart from the die pad 11 is an outer lead 12b. Formed at the end of the inner lead 12a of each lead 12 is a support section 58 in which a conductive layer 20 is formed. Electrodes 2 on a semiconductor chip 1 are respectively connected to the inner leads 12a of the corresponding leads 12 through respective metal wires 44, the middle section of each of the metal wires 44 being supported by the corresponding support section 58. The semiconductor chip 1, the die-pad 11, the inner leads 12a of the leads 12, the support sections 58, and the metal wires 44 are encapsulated in a plastic package body 57.

Since in this semiconductor device each of the metal wires 44 is supported by the support section 58, each of the metal wires 44 is prevented from coming into contact with adjacent metal wires 44 or any of the leads 12, for example, due to the injection pressure exerted when injecting resin into a mold for resin sealing. Accordingly, the distance between adjacent leads 12 can be made shorter, thereby making it possible to obtain a semiconductor device having a large number of pins and offering a high degree of reliability. Furthermore, since each support section 58 is provided with a conductive layer 20, the floating capacitance between the metal wires 44 is diminished, thereby avoiding generation of electrical noise.

Figure 8:
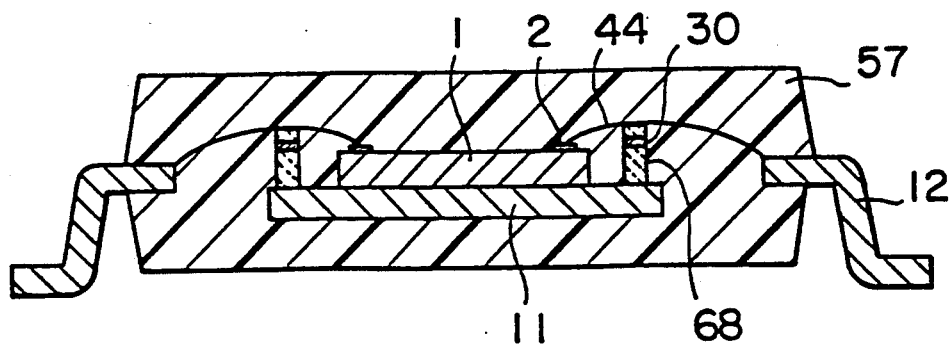
FIG. 8 is a sectional view showing a modification of the fifth embodiment.
Figure 9:
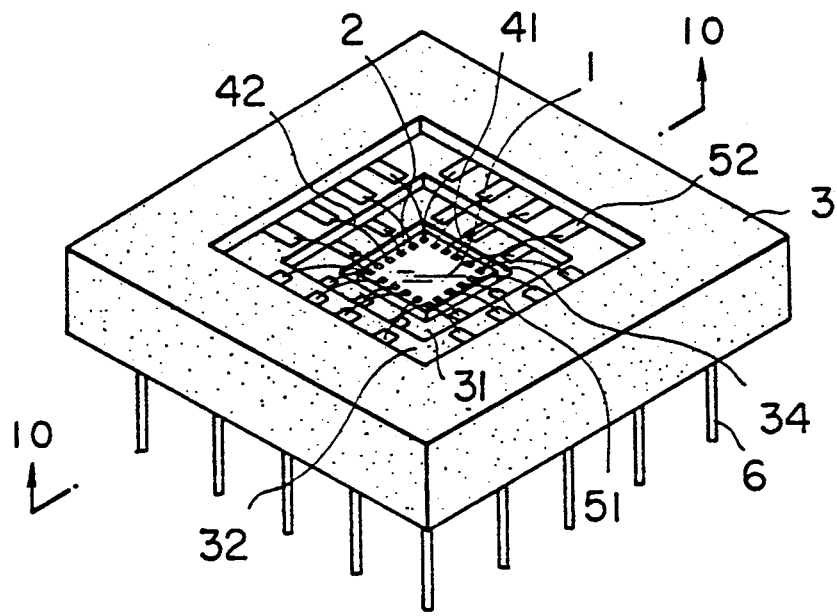
FIG. 9 is a perspective view showing a conventional semiconductor device.
Figure 10:
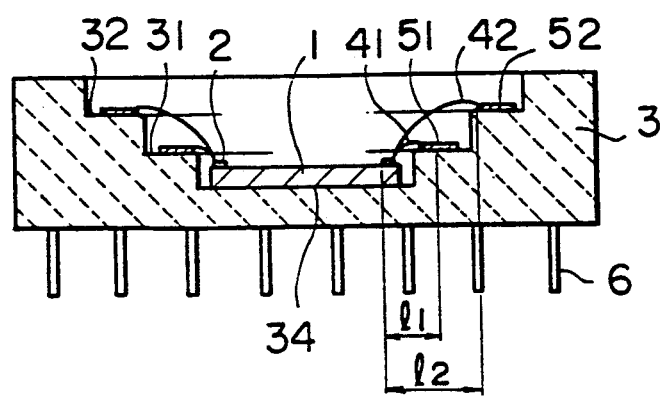
FIG. 10 is a sectional view taken along the line I—I of FIG. 9.
Figure 11:
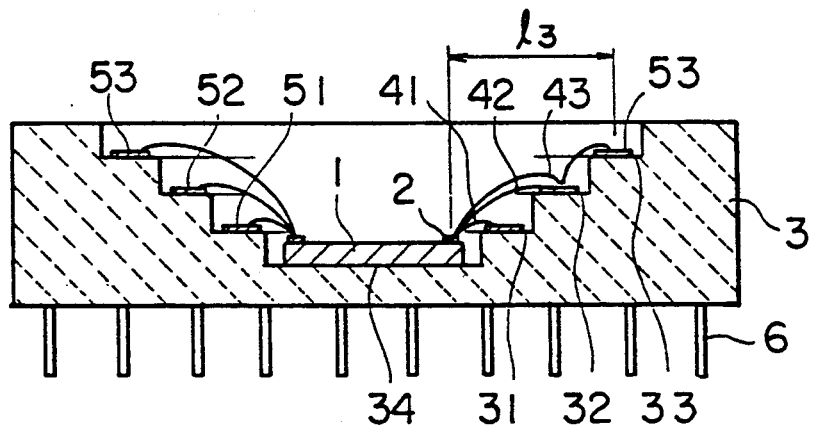
FIGS. 11 and 12 are a sectional view and a plan view, respectively, showing problems that occur in the prior art.
Figure 12:
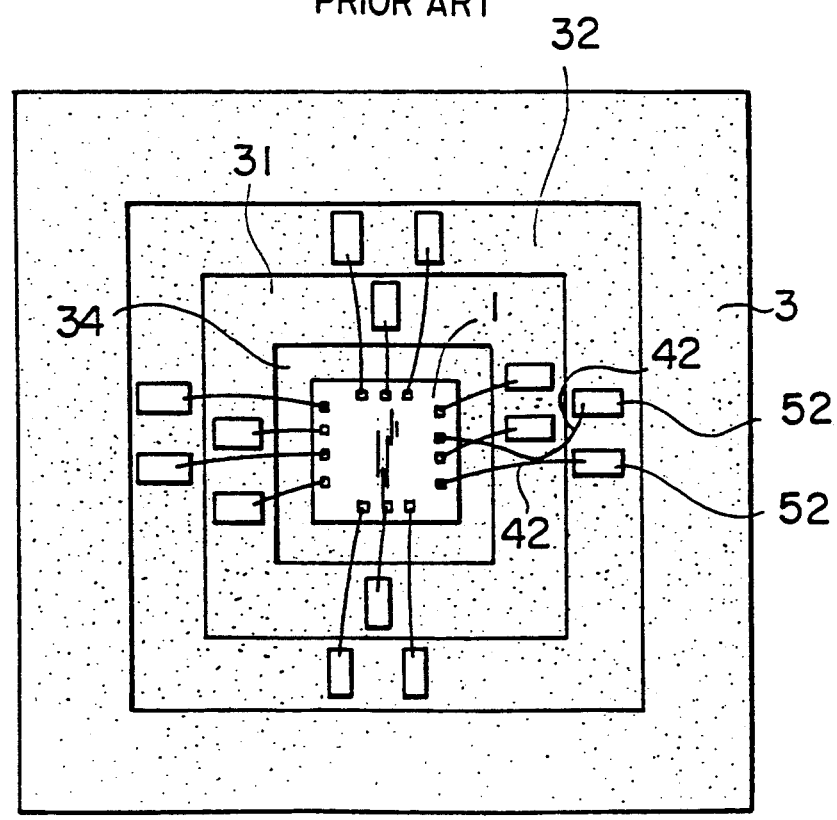

Instead of providing the support sections 58 on the leads 12, a support section 68 having a conductive layer 30 may be formed on the die-pad 11 along the periphery of the semiconductor chip 1, as shown in FIG. 8. This arrangement provides a similar effect.

What is claimed is:

1. A semiconductor device package comprising:
   a package body for receiving a semiconductor chip having a plurality of electrodes;
   a plurality of inner electrodes disposed on said package body, said inner electrodes being arranged in a plurality of rows around a semiconductor chip received in the package body;
   a plurality of outer electrodes disposed in said package body and electrically connected to the respective ones of said inner electrodes; and
   support means disposed on said package body between the rows of said inner electrodes for supporting metal wires connecting the inner electrodes or one row to the electrodes of the semiconductor chip and crossing over another of said rows of inner electrodes and including an electrically conducting portion for diminishing floating capacitance between metal wires supported by said support means.

2. A semiconductor device package as claimed in claim 1 wherein said support means comprises a protrusion projecting beyond the inner electrodes of a row of inner electrodes adjacent the support means.

3. A semiconductor device package as claimed in claim 1 wherein said rows of inner electrodes are disposed in stair step fashion so that at least two different rows are not coplanar.

4. A semiconductor device package as claimed in claim 1 wherein at least two of said rows of inner electrodes are coplanar.

5. A semiconductor device package as claimed in claim 1 wherein said plurality of rows of inner electrodes includes at least first, second, and third rows and said support means is disposed between said first and second and between said second and third rows of said inner electrodes.

6. A semiconductor device package as claimed in claim 1 wherein the inner electrodes of one row are offset with respect to the inner electrodes of an adjacent row.

7. A semiconductor device package as claimed in claim 1 comprising adhesion means disposed on said support means for fixedly mounting metal wires supported by said support means.

8. A semiconductor device package as claimed in claim 7 wherein said adhesion means comprises an electrically insulating adhesive.

9. A semiconductor device package as claimed in claim 1 wherein said electrically conductive portion comprises a conductive layer disposed within said support means.

10. A semiconductor device package as claimed in claim 1 wherein said electrically conducting portion is electrically connected to one of said outer electrodes.

11. A semiconductor device as claimed in claim 1 wherein said package body is a ceramic material.

12. A packaged semiconductor device comprising:
a semiconductor chip on which a plurality of electrodes are formed;
a die pad on which said semiconductor chip is mounted;
a plurality of leads having first and second ends and arranged around said semiconductor chip;
a plurality of metal wires having first and second ends connecting the respective electrodes of said semiconductor chip at the first ends of the wires to respective first ends of said leads at the second ends of the wires;
support means for supporting the respective metal wires intermediate the first and second ends;
an electrically conductive portion in said support means for diminishing floating capacitance between the metal wires supported on said support means; and
a package body encapsulating said semiconductor chip, said die pad, the first ends of said leads, said metal wires, said support means, and said electrically conductive portion with the second ends of said leads exposed externally of said package body.

13. A package semiconductor device as claimed in claim 12 wherein said support means comprises a protrusion disposed on said die-pad.

14. A package semiconductor device as claimed in claim 12 wherein said support means comprises a protrusion disposed on each of said leads.

15. A package semiconductor device as claimed in claim 12 wherein said electrically conductive portion comprises a conductive layer formed within said support means.

16. A package semiconductor device as claimed in claim 12 wherein said package body is a resin.

17. A semiconductor device package comprising:
a package body for receiving a semiconductor chip having a plurality of electrodes;
a plurality of inner electrodes disposed on said package body, said inner electrodes being arranged in a plurality of rows around a semiconductor chip received in the package body;
a plurality of outer electrodes disposed in said package body and electrically connected to the respective ones of said inner electrodes;
support means disposed on said package body between the rows of said inner electrodes for supporting metal wires connecting the inner electrodes of one row to the electrodes of the semiconductor chip and crossing over another of said rows of inner electrodes; and
adhesion means disposed on said support means for fixedly mounting metal wires supported by said support means to said support means.

18. A semiconductor device package as claimed in claim 17 wherein said adhesion means comprises an electrically insulating adhesive.

* * * * *

UNITED STATES PATENT AND TRADEMARK OFFICE
CERTIFICATE OF CORRECTION

PATENT NO. : 5,091,772

DATED : FEBRUARY 25, 1992

INVENTOR(S) : KOHARA ET AL

It is certified that error appears in the above-identified patent and that said Letters Patent is hereby corrected as shown below:

Claim 1, column 6, line 41, change "or" to --of--.

Signed and Sealed this

Eighth Day of June, 1993

Attest:

MICHAEL K. KIRK

Attesting Officer  Acting Commissioner of Patents and Trademarks